(12) United States Patent
Kashiwabara

(10) Patent No.: US 8,067,885 B2
(45) Date of Patent: Nov. 29, 2011

(54) ORGANIC EL DEVICE AND DISPLAY

(75) Inventor: Mitsuhiro Kashiwabara, Kanagawa (JP)

(73) Assignee: Sony Corporation, Tokyo (JP)

( * ) Notice: Subject to any disclaimer, the term of this patent is extended or adjusted under 35 U.S.C. 154(b) by 367 days.

(21) Appl. No.: 10/569,002

(22) PCT Filed: Aug. 20, 2004

(86) PCT No.: PCT/JP2004/012327
§ 371 (c)(1),
(2), (4) Date: Feb. 15, 2006

(87) PCT Pub. No.: WO2005/027586
PCT Pub. Date: Mar. 24, 2005

(65) Prior Publication Data
US 2006/0227079 A1    Oct. 12, 2006

(30) Foreign Application Priority Data

Aug. 22, 2003  (JP) ............... P2003-298269
Jan. 28, 2004  (JP) ............... P2004-019247

(51) Int. Cl.
*H01J 1/62* (2006.01)
*H01J 63/04* (2006.01)
(52) U.S. Cl. ......... 313/504; 313/506; 313/498; 313/501
(58) Field of Classification Search .......... 313/504–506, 313/498, 501
See application file for complete search history.

(56) References Cited

U.S. PATENT DOCUMENTS 6,285,039 B1 *  9/2001  Kobori et al. ............ 257/40
6,831,406 B1 * 12/2004  Fukuyama et al. ........... 313/504
2001/0031509 A1 * 10/2001  Yamazaki ................. 438/48

(Continued)

FOREIGN PATENT DOCUMENTS

EP    1 667 494    6/2006

(Continued)

OTHER PUBLICATIONS

"Multilayer White Light-Emitting Organic Electroluminescent Device," vol. 267, Science, published on Mar. 3, 1995, written by Junji Kido, Masato Kimura, and Katsutoshi Nagai.

(Continued)

*Primary Examiner* — Nimeshkumar D. Patel
*Assistant Examiner* — Thomas A Hollweg
(74) *Attorney, Agent, or Firm* — K&L Gates LLP

(57) ABSTRACT

An organic EL device and display are provided. A red light emitting layer, a green light emitting layer, a blue light emitting layer are laminated in this order between an anode and a cathode, and an intermediate layer "a" formed by use of an organic material is provided between the green light emitting layer and the blue light emitting layer. The HOMO-LUMO energy gap in the intermediate layer "a" is greater than the HOMO-LUMO energy gap of a green light emitting material constituting the green light emitting layer. In addition, the intermediate layer "a" has a hole transporting property. In the case of configuring a display by use of the organic EL devices, color filters are provided on the light take-out surface side. This makes it possible to provide an organic EL device with which light emission components for three colors of red, green and blue with a good balance suited to use for a full-color display can be obtained at a high luminance.

12 Claims, 5 Drawing Sheets

U.S. PATENT DOCUMENTS

| | | | |
|---|---|---|---|
| 2002/0113546 A1* | 8/2002 | Seo et al. | 313/504 |
| 2002/0197511 A1* | 12/2002 | D'Andrade et al. | 428/690 |
| 2004/0012331 A1* | 1/2004 | Yamazaki et al. | 313/506 |
| 2004/0032214 A1* | 2/2004 | Lee et al. | 315/169.2 |
| 2004/0124766 A1* | 7/2004 | Nakagawa et al. | 313/504 |

FOREIGN PATENT DOCUMENTS

| | | |
|---|---|---|
| JP | 08-078163 | 3/1996 |
| JP | 10-003990 | 1/1998 |
| JP | 2000-058264 | 2/2000 |
| JP | 2000-340361 | 12/2000 |
| JP | 2002-226722 | 8/2002 |
| JP | 2003229265 A * | 8/2003 |
| WO | 00/70655 | 11/2000 |
| WO | 02/091814 | 11/2002 |

OTHER PUBLICATIONS

"White Light Emission Obtained by Direct Color Mixing in Multi-Layer Organic Light-Emitting Devices," Department of Chemical Engineering, vol. 19, pp. 463-466, 2002, written by Sung Soo Lee and Sung Min Cho.

* cited by examiner

ORGANIC EL DEVICE AND DISPLAY

CROSS REFERENCE TO RELATED APPLICATIONS

The present application claims priority to Japanese Patent Document Nos. P2003-298269 filed on Aug. 22, 2003 and P2004-019247 filed on Jan. 28, 2004, the disclosures of which are herein incorporated by reference.

The present invention relates to an organic EL device in which an organic layer including a light emitting layer is interposed between an anode and a cathode, and a display using the organic EL device.

In recent years, as a display to be used in place of a cathode ray tube (CRT), flat displays light in weight and low in power consumption have been an object of vigorous research and development. Among the flat displays, those displays which use self-light-emitting type display devices (so-called light emitting devices) such as organic EL (Electroluminescence) devices and organic EL devices have been paid attention to as a display capable of being driven with low power consumption.

Configurations for achieving a full-color display mode with the display using the light emitting devices as above-mentioned include one in which an organic EL device capable of emitting white light is combined with color filters which respectively transmit only light in the blue, green or red wavelength region. In addition, as the organic EL device for emitting white light, one having a configuration in which a blue light emitting layer, a green light emitting layer, and a red light emitting layer are laminated in this order from the hole transport layer side and which has three wavelength light emission components has been disclosed (see Japanese Patent Laid-open No. Hei 10-3990 (see, particularly, FIG. 1)).

However, the white light emitting organic EL device with the above-mentioned configuration is insufficient in balance of respective luminous intensities in blue, green and red wavelength regions. Therefore, it has been impossible by use of such organic EL devices to obtain a display comparable in color reproduction performance with a CRT.

SUMMARY

Accordingly, it is an object of the present invention to provide an organic EL device having light emission components of three colors of red, green and blue in a good balance suited to use for a full-color display, having a high efficiency and being capable of stable light emission for a long time, and a display excellent in color reproduction performance and capable of being driven for a long time.

According to an embodiment of the present invention, there is provided an organic EL device including a plurality of light emitting layers different in emission color and laminated between an anode and a cathode, wherein an intermediate layer including an organic material is provided at least one location between the light emitting layers.

In the organic EL device configured as above, with the intermediate layer provided between the light emitting layers, it is ensured that the energy of excitons generated by re-coupling of electric charges in each light emitting layer is less liable to be transferred between the light emitting layers. Therefore, a lowering in luminous efficacy of a specified light emitting layer due to the transfer of the energy of the excitons is prevented from occurring. Accordingly, the balance between the luminous efficacies of the respective color light emitting layers is maintained.

Particularly, the energy of the excitons as above-mentioned is liable to be transferred into a layer in which a material with a small HOMO (Highest Occupied Molecular Orbital)-LUMO (Lowest Unoccupied Molecular Orbital) energy gap is present, with the result of a lowering in the luminous efficacy of a light emitting layer which has a great HOMO-LUMO energy gap. In view of this, it is preferable that the HOMO-LUMO energy gap in the intermediate layer provided between the light emitting layers is set to be greater than the HOMO-LUMO energy gaps of the materials constituting the light emitting layers adjacent to the intermediate layer. This configuration ensures that the transfer of the above-mentioned energy between the light emitting layers is securely prevented from occurring. In addition, the energy is prevented from being transferred into the intermediate layer to be released in the intermediate layer. Incidentally, the HOMO-LUMO energy gap in the intermediate layer may not necessarily be greater than the HOMO-LUMO energy gaps of all the materials constituting the light emitting layers adjacent to the intermediate layer; in the case where there is a material having a HOMO-LUMO energy gap so small as to permit easy transfer of the energy of the excitons, it suffices that the HOMO-LUMO energy gap in the intermediate layer is greater than the HOMO-LUMO energy gap of this material. It should be noted here, however, that if the HOMO-LUMO energy gap in the intermediate layer is greater than the HOMO-LUMO energy gaps of all the materials constituting the light emitting layers adjacent to the intermediate layer, the above-mentioned energy transfer between the light emitting layers is securely prevented from occurring.

Furthermore, in the organic EL device configured as above, electrons or holes are transported into each light emitting layer through the light emitting layer adjacent thereto. Therefore, it is preferable for the intermediate layer provided between the light emitting layers to have an electron transporting property or a hole transporting property. This promises easy transportation of electrons or holes into the light emitting layers adjacent to the intermediate layer. Therefore, in the case where the light emitting layer provided on the cathode side is weak in luminous intensity, provision of an intermediate layer having both a hole transporting property and an electron blocking property on the anode side of this light emitting layer makes it possible to increase the amount of the holes transported into the light emitting layer provided on the cathode side and to restrict the amount of the electrons transported into the light emitting layer provided on the anode side, whereby the probability of re-coupling between electrons and holes in the light emitting layer under consideration can be increased, and the luminous intensity can be enhanced. On the other hand, in the case where the light emitting layer provided on the anode side is weak in luminous intensity, provision of an intermediate layer having both an electron transporting property and a hole blocking property on the cathode side of the light emitting layer makes it possible to increase the amount of the electrons transported into the light emitting layer provided on the anode side and to restrict the amount of the holes transported into the light emitting layer provided on the cathode side, whereby the probability of re-coupling between electrons and holes in the light emitting layer under consideration can be increased, and the luminous intensity can be enhanced.

Furthermore, the light emitting layers may include a red light emitting layer, a green light emitting layer, and a blue light emitting layer laminated in this order from the anode side, whereby holes can be sufficiently injected into the green light emitting layer and the blue light emitting layer on the cathode side relative to the red light emitting layer, while sufficiently securing the luminous efficacy in the red light emitting layer.

In this case, an intermediate layer having both a hole transporting property and an electron blocking property is provided between the green light emitting layer and the blue light emitting layer. This ensures that the injection of holes into the blue light emitting layer provided on the most cathode side can be promoted, and the injection of electrons into the green light emitting layer can be restricted, so that a good probability of re-coupling between holes and electrons in the blue light emitting layer is secured. This also provides a well-balanced white light emission. In this instance, it is preferable for the LUMO energy level (energy value) in the intermediate layer to be higher than the LUMO energy level of an electron transporting component serving as a host material in the green light emitting layer, for providing a barrier against the injection of electrons into the green light emitting layer.

In this case, further, an intermediate layer having both a hole transporting property and an electron blocking property may be provided between the red light emitting layer and the green light emitting layer. This ensures that the injection of holes into the blue light emitting layer and the green light emitting layer which are provided on the cathode side relative to the intermediate layer is promoted, the injection of electrons into the red light emitting layer can be restricted, and the probabilities of re-coupling between holes and electrons in the blue light emitting layer and the green light emitting layer are secured. This also provides a well-balanced white light emission. In this instance, it is preferable for the LUMO energy level in the intermediate layer to be higher than the LUMO energy level of an electron transporting component in the red light emitting layer, for providing a barrier against the injection of electrons into the red light emitting layer 12. This configuration makes it possible to restrict the injection of electrons into the red light emitting layer.

Besides, according to the present invention, there is provided a display wherein a color filter is provided on the light take-out surface side of the above-described organic EL device.

According to the display as above, by combining a plurality of the organic EL devices excellent in balance between emission colors with color filters for the respective colors, it is possible to take out the rays in the emission colors with a good balance.

Additional features and advantages of the present invention are described in, and will be apparent from, the following Detailed Description and the Figures.

DETAILED DESCRIPTION

Figure 1:
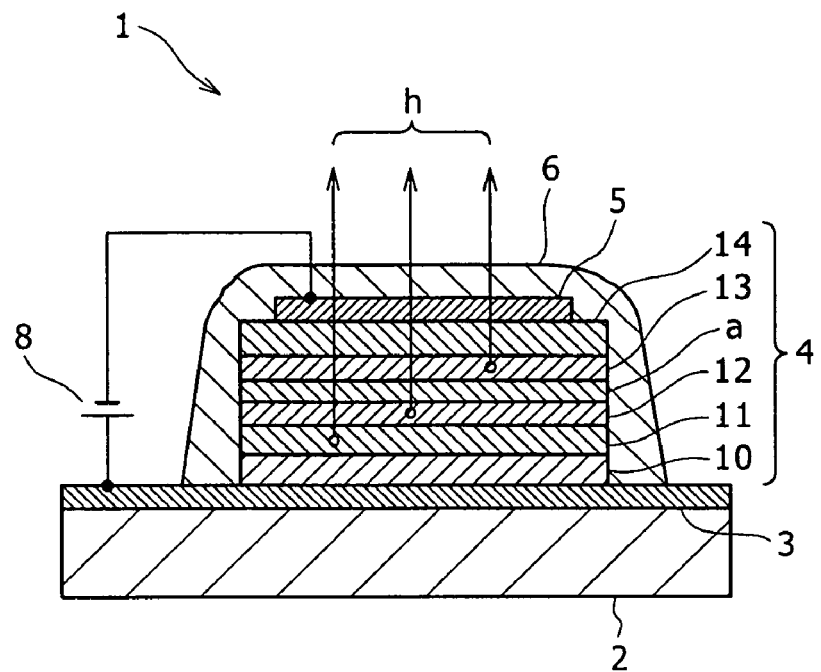
FIG. 1 is a sectional diagram showing a configuration of an organic EL device according to an embodiment of the present invention.
Figure 2:
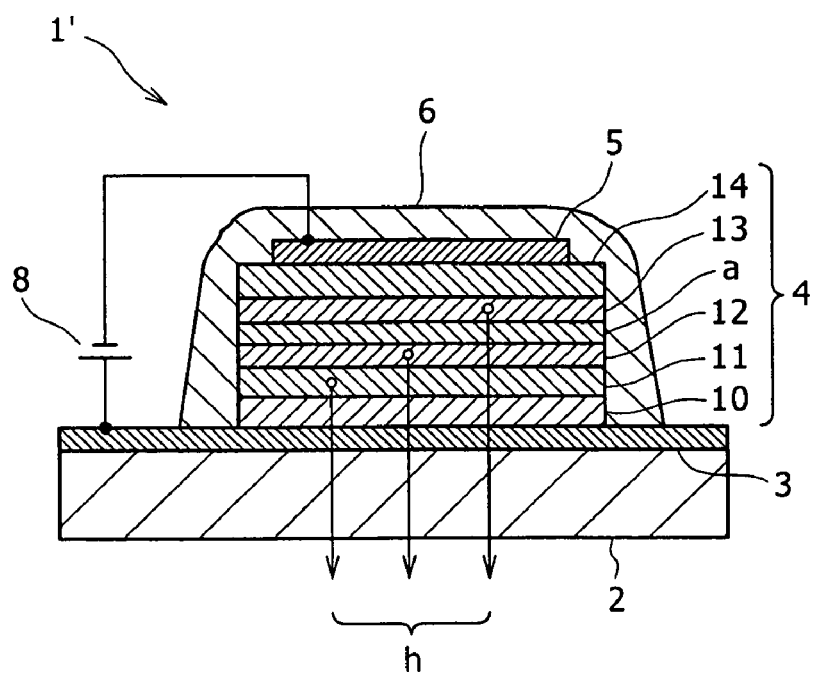
FIG. 2 is a sectional diagram showing another configuration (Example 1) of the organic EL device according to an embodiment of the present invention.

Now, the configuration of an organic EL device according to the present invention will be described in detail below based on the drawings. FIGS. 1 and 2 are sectional diagrams schematically showing the organic EL devices of the present invention.

Each of the organic EL devices 1 and 1' shown in these drawings is provided, for example, in each pixel of a substrate 2 constituting a display, includes an anode 3, an organic layer 4 and a cathode 5 laminated in this order from the side of the substrate 2, and is covered gas-tight with a protective film 6. Particularly, the organic EL device 1 shown in FIG. 1 is configured to be of the so-called top emission type, in which the light h emitted by the organic EL device 1 is taken out on the side opposite to the substrate 2. On the other hand, the organic EL device 1' shown in FIG. 2 is configured to be of the so-called bottom emission type, in which the light h emitted by the organic EL device 1' is taken out on the side of the substrate 2.

Next, detailed configurations of the component parts of each of the organic EL devices 1 and 1' will be described in the order of the substrate 2, the anode 3, the cathode 5 paired with the anode 3, and the organic layer 4 sandwiched between the anode 3 and the cathode 5.

<Substrate>

First, the substrate 2 is composed of a glass substrate, a silicon substrate, a plastic substrate, or a TFT (thin film transistor) substrate provided with a TFT, or the like; particularly, in the case of the bottom emission type organic EL device shown in FIG. 2, the substrate 2 is composed of a light transmitting material. In addition, where the organic EL device 1, 1' is used in combination with other display device, the substrate may be used in common for both the devices.

<Anode>

The anode 3 provided on the substrate 2 is composed of a conductive material having a great work function. Examples of the conductive material having a great work function include nickel, silver, gold, platinum, palladium, selenium, rhodium, ruthenium, iridium, rhenium, tungsten, molybdenum, chromium, tantalum, niobium, alloys of these metals, tin oxide ($SnO_2$), indium tin oxide (ITO), zinc oxide, and titanium oxide.

<Cathode>

On the other hand, the cathode 5 connected to the anode 3 through a power supply 8 is composed of a conductive material having a small work function. Examples of the conductive material having a small work function include alloys of an active metal such as Li, Mg, Ca, etc. with such a metal as Ag, Al, In, etc., and laminates of these alloys. In addition, a structure may be adopted in which a layer of a compound of an active metal such as Li, Mg, Ca, etc. with a halogen such as fluorine, bromine, etc. or oxygen or the like is inserted in a thin form between the cathode 5 and the organic layer 4.

Of the anode 3 and the cathode 5 as above, the one electrode disposed on the side of taking up the emitted light h generated in the organic layer 4 is composed by appropriately selecting and using a light transmitting one of the above-mentioned materials, and the thickness thereof is so regulated as to obtain a light transmittance suited to the use. On the other hand, the other electrode is composed by appropriately selecting and using a material having a good reflectance.

In addition, the anode 3 and the cathode 5 are patterned into a suitable shape depending on the drive system of the display to be constituted by use of the organic EL devices 1 or 1'. For example, in the case where the drive system of the display is the simple matrix type, the anode 3 and the cathode 5 are formed in the form of stripes intersecting each other, and the intersection portions constitute the organic EL devices 1, 1'. In the case where the drive system of the display is the active matrix type having a TFT for each pixel, the anode 3 is patterned according to each of a plurality of pixels arranged, in the state of being connected to the TFT similarly provided for each pixel through a contact hole (not shown) formed in a layer insulation film covering the TFTs. On the other hand, the cathode 5 may be formed in the form of a solid film formed to cover the entire surface of the substrate 2, to be used as a common electrode for the pixels. It should be noted here that in the case of adopting the active matrix type as the drive system of the display, it is preferable to use the top emission type organic EL device 1 shown in FIG. 1, since it is thereby possible to enhance the numerical aperture of the device.

<Organic layer>

The organic layer 4 sandwiched between the anode 3 and the cathode 5 includes a hole transport layer 10, a red light emitting layer 11, a green light emitting layer 12, a blue light emitting layer 13, and an electron transport layer 14 laminated in this order from the side of the anode 3. Particularly, the organic layer 4 is characterized in that the intermediate layer "a" is provided between the green light emitting layer 12 and the blue light emitting layer 13. Now, the configurations of the layers 10-15 and the intermediate layer "a" will be described in this order.

<Hole Transport Layer>

First, the hole transport layer 10 provided on the anode 3 is a layer designed to transport the holes (positive holes). The hole transport layer 10 may be composed by laminating a plurality of hole transporting materials, for enhancing the hole transport performance.

Examples of the material (hole transporting material) for forming the hole transport layer 10 include heterocyclic conjugated monomers, oligomers and polymers, including not only benzidine and derivatives thereof, styrylamine and derivatives thereof, and triphenylmethane and derivatives thereof but also porphyrin and derivatives thereof, triazole and derivatives thereof, imidazole and derivatives thereof, oxadiazole and derivatives thereof, polyarylalkanes and derivatives thereof, phenylenediamine and derivatives thereof, arylamines and derivatives thereof, oxazole and derivatives thereof, anthracene and derivatives thereof, fluorenone and derivatives thereof, hydrazine and derivatives thereof, stilbene and derivatives thereof, phthanocyanine and derivatives thereof, polysilane based compounds, vinylcarbazole based compounds, thiophene based compounds, aniline based compounds, etc.

Specific, but not limitative, examples of the hole transport materials include α-naphthylphenyldiamine (α-NPD), porphyrin, metallotetraphenylporphrin, metallonaphthalocyanine, 4,4',4''-trimethyltriphenylamine, 4,4',4''-tris(3-methylphenylphenylamino)triphenylamine (m-MTDATA), N,N,N',N'-tetrakis(p-tolyl)p-phenylenediamine, N,N,N',N'-tetraphenyl-4,4'-diaminobiphenyl, N-phenylcarbazole, 4-di-p-tolylaminostylbene, poly(paraphenylenevinylene), poly (thiophenevinylene), poly(2,2'-thienylpyrrole), etc.

<Red Light Emitting Layer>

In the next place, the red light emitting layer 11 provided on the hole transport layer 10 is preferably so designed that some of the holes injected through the hole transport layer 10 are re-coupled in the red light emitting layer 11 to give red light emission, and the rest of the holes not contributing to the light emission in the red light emitting layer are transported into the green light emitting layer 12, for contributing to green light emission and blue light emission.

Such a red light emitting layer 11 is configured by combining the required materials appropriately selected from (a) a red light emitting material (fluorescent or phosphorescent), (b) a hole transporting material, (c) an electron transporting material and (d) a positive and negative charge transporting material. Each of these materials is used together with a single or a plurality of materials appropriately selected from among the following material categories, as required, for securing light emission performance and hole transport performance.

The material categories include cyclopentadiene derivatives, tetraphenylbutadiene derivatives, triphenylamine derivatives, oxadiazole derivatives, bathophenanthroline derivatives, pyrazoloquinoline derivatives, styrylbenzene derivatives, styrylarylene derivatives, aminostyryl derivatives, silole derivatives, thiophene ring derivatives, pyridine ring compounds, perinone derivatives, perylene derivatives, oligothiophene derivatives, cumarin derivatives, rubrene derivatives, quinacridone derivatives, squalium derivatives, porphyrin derivatives, styryl based coloring matter, tetracene derivatives, pyrazoline derivatives, trifumanylamine derivatives, anthracene derivatives, diphenylanthracene derivatives, pyrene derivatives, carbazole derivatives, oxadiazole dimer, pyrazoline dimer, aluminum-quinolinol complex, benzoquinolinol-beryllium complex, benzoxazole-zinc complex, benzothiazole-zinc complex, azomethyl-zinc complex, porphyrin-zinc complex, europium complexes, iridium complexes, platinum complexes, etc. and metal complexes having such a metal as Al, Zn, Be, Pt, Ir, Tb, Eu, Dy, etc. as a center metal and having an oxadiazole, thiadiazole, phenylpyridine, phenylbenzoimidazole or quinoline structure or the like as a ligand.

Particularly, specific examples of (a) red light emitting material include bis(aminostyryl)naphthalene (BSN) represented by the following formula (1), which is a styrylarylene derivative. Such a styrylarylene based material, examples of which are described in Japanese Patent Laid-open No. 2002-226722, can be used to dope a host material therewith in a high concentration, and has a hole transporting property due to its triphenylamine skeleton. Therefore, when such a red light emitting material is used, efficient red light emission and a high hole transporting property can be obtained, which is the reason why it is preferable to form the red light emitting layer 11 in contact with the hole transport layer 10.

Formula (1):

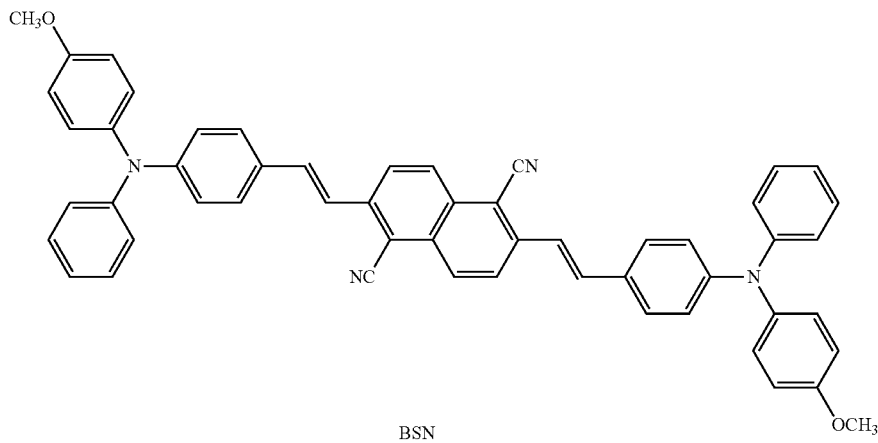

BSN

Specific, but not limitative, examples of (b) hole transporting material include α-NPD, and specific, but not limitative, examples of (c) electron transporting material include 4,4'-bis(2,2-dphenyl-ethen-1-yl)-diphenyl (DPVBi) represented by the following formula (2), which is a styrylarylene derivative.

Formula (2):

DPVBi

<Green Light Emitting Layer>

The green light emitting layer 12 provided on the red light emitting layer 11 preferably has a positive and negative charge transporting property for transporting both holes and electrons. This characteristic property ensures that some of the holes injected through the red light emitting layer 11 contribute to light emission in the green light emitting layer 12, whereas the rest of the holes are transported into the blue light emitting layer 13, and that some of the electrons injected from the side of the blue light emitting layer 13 contribute to light emission in the green light emitting layer 12, whereas the rest of the electrons are transported into the red light emitting layer 11. This makes it possible to achieve respective light emissions from the red, green and blue light emitting layers 11, 12, 13.

As a method for providing the green light emitting layer 12 with the positive and negative charge transporting property, there may be contemplated the methods of (1) doping a positive and negative charge transporting host with a green light emitting material, (2) doping a hole transporting host with an electron transporting green light emitting material, (3) doping an electron transporting host with a hole transporting green light emitting material, (4) doping a mixed host composed of a hole transporting material and an electron transporting material with a green light emitting material, and so on. In this instance, the hole transporting material in the green light emitting layer 12 may be the hole transporting material used to form the hole transport layer. In addition, the electron transporting material in the green light emitting layer 12 may be the electron transporting host material constituting the blue light emitting layer 13 which will be described below.

As the material(s) for constituting the green light emitting layer 12, a single material or a plurality of materials are appropriately selected from among the above-mentioned material categories.

Furthermore, in the organic EL device 1 according to the present invention in which the red light emitting layer 11 is present on the side of the hole transport layer 10, the green light emitting layer 12 is preferably provided between the red light emitting layer 11 and the blue light emitting layer 13. This is because of the problems that (1) in the case where the red light emitting layer 11 and the blue light emitting layer 13 are adjacent to each other, the energy of the excitons generated in the blue light emitting layer 13 would easily move into the red light emitting layer 11. As a result, a sufficient blue light intensity would not easily be obtained, and that (2) in the case where the blue light emitting layer 13 is provided between the red light emitting layer 11 and the green light emitting layer 12, the energy of the excitons would be deprived by both the red light emitting layer 11 and the green light emitting layer 12, and the like problems. Besides, in the case of the configuration in which, for example, an electron transporting host is doped with a hole transporting green light emitting material, each of the layers constituting the organic layer 4 can be formed by binary co-deposition, which promises a function as a white device and eliminates the need for such a complicated manufacturing process as that for ternary co-deposition.

<Blue Light Emitting Layer>

In the next place, the blue light emitting layer 13 provided on the green light emitting layer 12 has an electron transporting property. This ensures that some of the electrons injected through the electron transport layer 14 into the blue light emitting layer 13 contribute to blue light emission in the blue light emitting layer 13, whereas the rest of the electrons are transported into the green light emitting layer 12 and the red light emitting layer 11 to contribute to green light emission and red light emission.

The blue light emitting layer 12 is configured by combining the required materials appropriately selected from among (a) a blue light emitting material (fluorescent or phosphorescent), (b) a hole transporting material, (c) an electron transporting material, and (d) a positive and negative charge transporting material. As each of these materials, a single material or a plurality of materials are appropriately selected from among the above-mentioned material categories, as required, so as to secure light emission performance and hole transport performance.

Particularly, specific examples of (a) blue light emitting material include perylene, specific examples of (b) hole transporting material include α-NPD, and specific examples of (c) include DPVBi of the above formula (2), which is a styrylarylene derivative, the examples being not limitative.

In addition, the blue light emitting layer 13 may have a positive and negative charge transporting blue light emitting layer and an electron transporting blue light emitting layer laminated in this order from the side of the green light emitting layer 12. With the blue light emitting layer 13 having such a laminate structure, holes can be efficiently transported to the whole region inside the blue light emitting layer 13, which enables a highly efficient and stable light emission with a high color purity. As a method for providing the blue light emitting layer 13 with the positive and negative charge transporting property, there may be contemplated the methods of (1) doping a positive and negative charge transporting host with a blue light emitting material, (2) doping a hole transporting host with an electron transporting blue light emitting material, (3) doping an electron transporting host with a hole transporting blue light emitting material, (4) doping a mixed host composed of a hole transporting material and an electron transporting material with a blue light emitting material, and so on.

The blue light emitting layer 13 according to the present invention is so configured that the energy of excitons generated through re-coupling of positive and negative charges in the blue light emitting layer 13 is made to contribute to the light emission in the blue light emitting layer 13 while minimizing the movement of the energy into the red light emitting layer 11 and the green light emitting layer 12. Therefore, it is preferable for the blue light emitting layer 13 to be provided on the most cathode 5 side.

<Electron Transport Layer>

In addition, the electron transport layer 14 provided between the blue light emitting layer 13 and the cathode 5 is a layer so designed as to transport electrons. The electron transport layer 14 may be configured by laminating a plurality of electron transport materials, for enhancing the electron transport performance.

Non-limitative examples of the electron transporting material as above include 8-hydroxyquinoline aluminum (Alq3), 8-hydroxymethylquinoline aluminum, anthracene, naphthalene, phenanthrene, pyrene, chrysene, perylene, butadiene, cumarin, acridine, stilbene, and derivatives thereof.

<Intermediate Layer>

In the next place, the intermediate layer "a" provided between the green light emitting layer 12 and the blue light emitting layer 13 is composed of an organic material having a HOMO-LUMO energy gap greater than the HOMO-LUMO energy gaps of the materials constituting the green light emitting layer 12 and the blue light emitting layer 13.

Here, in order to prevent the energy of excitons generated in the blue light emitting layer 13 from being transferred into the green light emitting layer 12, the intermediate layer is composed of an organic material having a HOMO-LUMO energy gap greater than the HOMO-LUMO energy gap of the dopant which is a light emitting material in the green light emitting layer 12.

In addition, in the case where, in the light emissions in the light emitting layers 11, 12 and 13, the luminous intensity in the green light emitting layer 12 disposed on the anode 3 side of the intermediate layer "a" is strong whereas the luminous intensity in the blue light emitting layer 13 disposed on the cathode 5 side of the intermediate layer a is weak, the intermediate layer "a" is formed by use of a material which has the above-mentioned energy gap characteristic and has both a hole transporting property and an electron blocking property. On the other hand, in the case where the luminous intensities are contrary to the above, the intermediate layer "a" is formed by use of a material which has the above-mentioned energy gap characteristic and has both an electron transporting property and a hole blocking property. Incidentally, here, the intermediate layer "a" has both a hole transporting property and an electron blocking property.

The organic material constituting the intermediate layer "a" having such characteristics is appropriately selected among the materials usable for the hole transporting layer 10, the materials usable for the light emitting layers 11-13, and the materials usable for the electron transport layer 14. In this case, taking into account the energy gap characteristics of the materials constituting the light emitting layers 12 and 13 disposed adjacent to the intermediate layer a, a material with which the above-mentioned characteristics can be obtained is selected for forming the intermediate layer a. Specific examples of the organic materials to be used for the organic EL device 1, 1' in the present embodiment include those materials which have a hole transporting property and a comparatively great HOMO-LUMO energy gap, such as TPD, α-NPD, CBP, etc.

Besides, the film thickness of the intermediate layer "a" is set in the range of 0.1-20 nm, preferably 0.5-10 nm. This permits the intermediate layer "a" to display its functions sufficiently. If the film thickness of the intermediate layer "a" is below this range, the effects of provision of the intermediate layer "a" which are to be described below cannot be obtained satisfactorily. On the other hand, if the film thickness of the intermediate layer "a" is above the range, such problems as a rise in the drive voltage due to the organic layer 4, a lowering in the drive life, and an unsatisfactory control of the charge re-coupling regions would be generated.

Incidentally, the position where to dispose the intermediate layer "a" is not limited to the position between the green light emitting layer 12 and the blue light emitting layer 13, and the intermediate layer "a" can be provided at any position between the light emitting layers. In the present embodiment, the intermediate layer "a" is provided at at least one of the position between he green light emitting layer 12 and the blue light emitting layer 13 and the position between the red light emitting layer 11 and the green light emitting layer 12. In addition, in the case where a further plurality of light emitting layers are laminated, the intermediate layer "a" can be provided at each position between the light emitting layers. It should be noted here, however, that the same characteristics as above-mentioned are provided, taking into account the characteristics of the intermediate layer "a" provided at any position and the light emitting layers disposed adjacent to the intermediate layer a.

Besides, the organic layer 4 configured to have the above-described laminate structure can be formed by applying a known method, such as vacuum evaporation and spin coating, while using the organic materials synthesized by known methods.

In the case of configuring a full-color display by combining the organic EL devices 1 or 1' configured as above with color filters, respective color filters for transmitting only the rays in the blue, green and red wavelength regions are provided on the light take-out surface side of the plurality of the organic EL devices 1 or 1'.

According to the organic EL device 1 or 1' configured as above-described, with the intermediate layer "a" provided between the green light emitting layer 12 and the blue light emitting layer 13, the energy of excitons generated by re-coupling of electric charges in each of the green light emitting layer 12 and the blue light emitting layer 13 are not liable to be transferred between the green light emitting layer 12 and the blue light emitting layer 13. With the organic EL deice 1 or 1' having such a laminate structure, there have been cases where the energy of the excitons generated in the blue light emitting layer 13 having a great HOMO-LUMO energy gap would be transferred into the green light emitting layer 12, with the result of a lowering in the luminous intensity in the blue light emitting layer 13. In the present embodiment, however, the HOMO-LUMO energy gap in the intermediate layer "a" is set to be greater than the HOMO-LUMO energy gap of the dopant which is a light emitting material in the green light emitting layer 12, whereby it is ensured that the energy of the excitions generated in the blue light emitting layer 13 is not liable to be transferred into the green light emitting layer 12, and the intensity of blue light emission in the blue light emitting layer 13 can be kept high. In addition, the energy is prevented from being released into the intermediate layer "a" to be transferred in the intermediate layer a.

Moreover, with the red light emitting layer 11 provided on the most anode 3 side, the red light emitting layer 11 can be formed by use of a hole transporting red light emitting material capable of doping therewith in a high concentration so that holes will be easily transferred into the green light emitting layer 12 and the blue light emitting layer 13 which are disposed on the cathode 5 side relative to the red light emitting layer 11.

Figure 3:
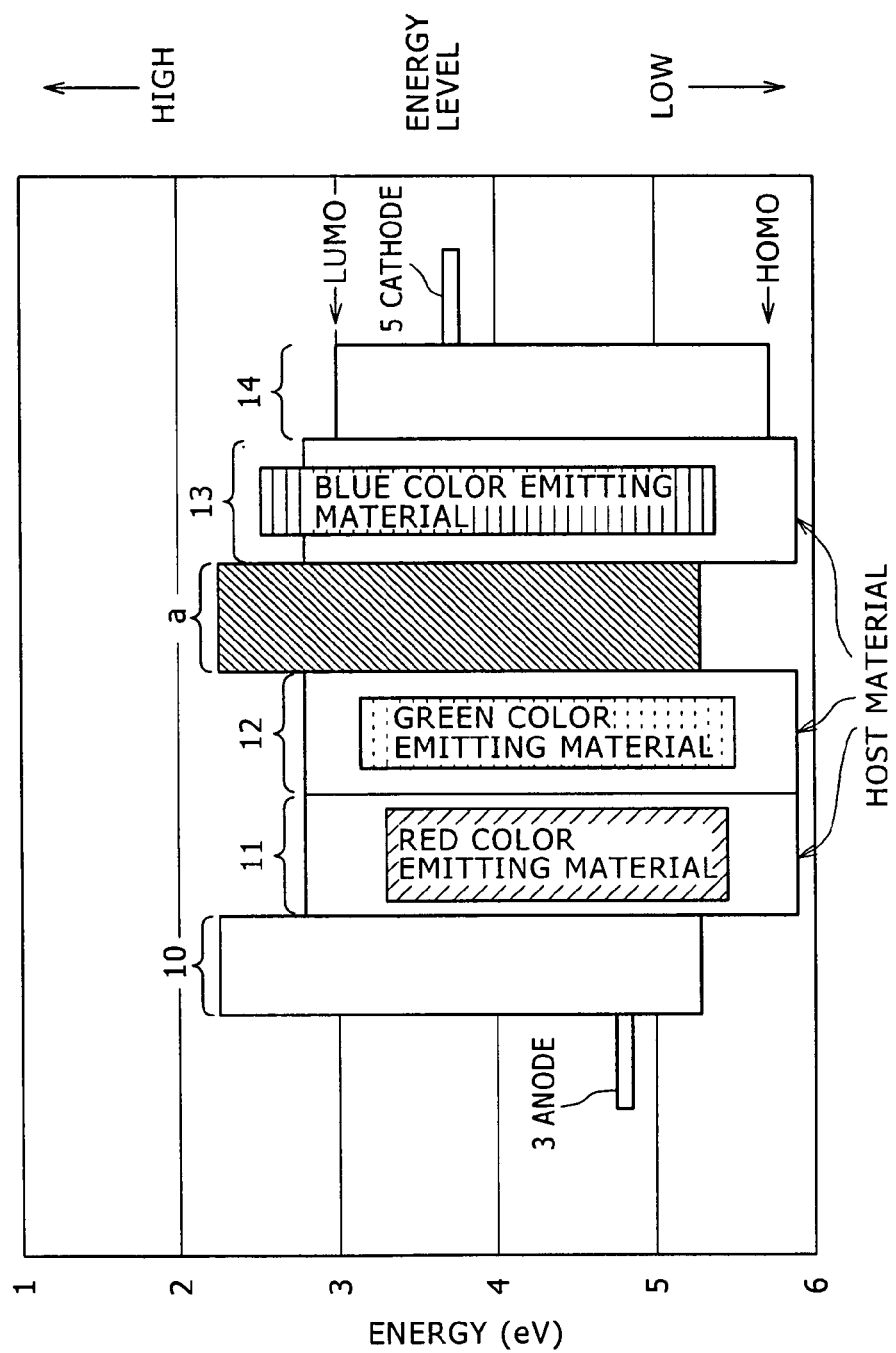
FIG. 3 is a schematic diagram showing the energy level in the organic EL device according to the embodiment of the present invention.

In such a condition, particularly since the intermediate layer "a" in the present embodiment has both a hole transporting property and an electron blocking property, holes can be sufficiently transported into the blue light emitting layer 13 provided on the cathode 5 side relative to the intermediate layer a, and the injection of electrons into the green light emitting layer 12 can be restricted, so that the probability of re-coupling between electrons and holes in the blue light emitting layer 13 can be enhanced. This also contributes to enhancement of the intensity of blue light emission. In this case, for providing a barrier against the injection of electrons into the green light emitting layer 12, it is preferable that the LUMO energy level in the intermediate layer "a" having the hole transporting property is higher than the LUMO energy level of the electron transporting component serving as the host material of the green light emitting layer 12. Such a configuration is shown, in terms of energy level, in FIG. 3. In the case of the configuration in which the hole transporting layer 10, the red light emitting layer 11, the green light emitting layer 12, the intermediate layer a, the blue light emitting layer 13, and the electron transporting layer 14 are laminated in this order from the anode 3 side between the anode 3 and the cathode 5, it is preferable that the LUMO energy level [namely, the value of Energy (eV)] in the intermediate layer "a" is higher than the LUMO energy level [namely, the value of Energy (eV)] of the electron transporting component serving as the host material of the green light emitting layer. This configuration makes it possible to restrict the injection of electrons into the green light emitting layer 12.

Therefore, in the light emitting layers 11, 12 and 13, the rays in the respective colors can be taken out with good balance and at high efficiency, the balance between the luminous intensities for the respective colors is good, and white light emission with a good luminous efficacy can be obtained.

Incidentally, in the embodiment as above-described, the case where the intermediate layer "a" is disposed between the green light emitting layer 12 and the blue light emitting layer 13 has been described as an example. However, as above-mentioned, it suffices that the intermediate layer is provided at at least one of the position between the green light emitting layer 12 and the blue light emitting layer 13 and the position between the red light emitting layer 11 and the green light emitting layer 12; in any case, the intermediate layer provided at any position is configured to have the same characteristics as above-described, taking into account the characteristics of the light emitting layers disposed adjacent to the intermediate layer.

Figure 4:
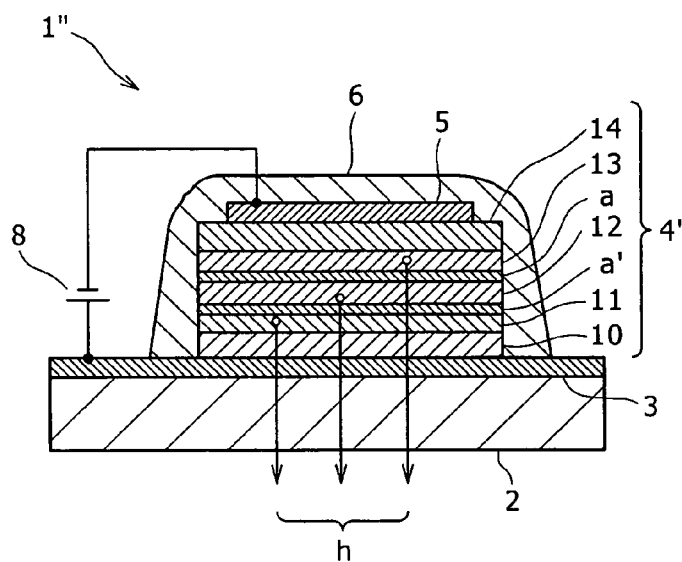
FIG. 4 is a sectional diagram showing a further embodiment (Example 2) of the organic EL device according to an embodiment of the present invention.

For example, in an organic EL device 1" in which an intermediate layer "a" is provided also between the red light emitting layer 11 and the green light emitting layer 12 as shown in FIG. 4, the intermediate layer "a'" is formed by use of an organic material having a HOMO-LUMO energy gap greater than the HOMO-LUMO energy gaps of the materials constituting the red light emitting layer 11 and the green light emitting layer 12. In a specific example, for preventing the energy of excitons generated in the green light emitting layer 12 from being transferred into the red light emitting layer 11, the intermediate layer "a'" is formed by use of an organic material having a HOMO-LUMO energy gap greater than the HOMO-LUMO energy gap of the dopant which is a light emitting material in the red light emitting layer 11.

In addition, like in the above-described embodiment, in the case where the luminous intensity in the red light emitting layer 11 disposed on the anode 3 side of the intermediate layer "a'" disposed between the red light emitting layer 11 and the green light emitting layer 12 is strong and the luminous intensity in the green light emitting layer 12 disposed on the cathode 5 side of the intermediate layer "a'" is weak, the intermediate layer "a'" is formed by use of a material which has the above-mentioned energy gap characteristic and has both a hole transporting property and an electron blocking property. On the other hand, in the case where the luminous intensities are contrary to the above, the intermediate layer "a" is formed by use of a material which has the above-mentioned energy gap characteristic and has both an electron transporting property and a hole blocking property.

In the organic EL device 1" configured in this way, the provision of the intermediate layer "a'" between the red light emitting layer 11 and the green light emitting layer 12 ensures that the energy of excitons generated by re-coupling of electric charges in each of the red light emitting layer 11 and the green light emitting layer 12 is not liable to be transferred between the red light emitting layer 11 and the green light emitting layer 12. Particularly where the intermediate layer "a'" has both a hole transporting property and an electron blocking property, holes can be sufficiently transported into the green light emitting layer 12 and the blue light emitting layer 13 provided on the cathode 5 side relative to the intermediate layer a', the injection of electrons into the red light emitting layer 11 can be restricted, and the probabilities of re-coupling between electrons and holes in the green light emitting layer 12 and the blue light emitting layer 13 can be enhanced. In this case, for providing a barrier against the injection of electrons into the red light emitting layer 11, it is preferable that the LUMO energy level in the intermediate layer "a'" having the hole transporting property is higher than the LUMO energy level of the electron transporting component in the red light emitting layer 11. This makes it possible to restrict the injection of electrons into the red light emitting layer 11.

Therefore, like in the above-described embodiment, in the respective light emitting layers 11, 12 and 13, the rays in the respective colors can be taken out with good balance and at high efficiency, the balance between the luminous intensities for the respective colors is good, and white light emission with a good luminous efficacy can be obtained.

Besides, in the embodiment as above-described, the configuration wherein the red light emitting layer 11, the green light emitting layer 12, and the blue light emitting layer 13 are laminated in this order from the side of the anode 3 has been described, but the present invention is not limited to such a lamination order, and a reverse lamination order can also be adopted. It should be noted here, however, that the electron transporting property of each of the light emitting layers is also changed appropriately. Specifically, the blue light emitting layer provided on the most anode 3 side has at least a hole transporting property, the green light emitting layer provided on the cathode 5 side of the blue light emitting layer has a positive and negative charge transporting property, and the red light emitting layer provided on the most cathode 5 side has at least an electron transporting property. In such a configuration, also, the characteristics of the intermediate layer provided between the light emitting layers can be considered in the same way as above-described, and the same effects as above can be obtained.

For example, when an intermediate layer having a great HOMO-LUMO energy gap as above-mentioned is provided between the blue light emitting layer on the most anode 3 side and the green light emitting layer on the cathode 5 side thereof, the energy of excitons generated in each of the blue light emitting layer and the green light emitting layer can be prevented from being transferred between the light emitting layers. Besides, in such a configuration, when the intermediate layer has both an electron transporting property and a hole blocking property, the probability of re-coupling of electric charges in the blue light emitting layer disposed on the anode 3 side can be enhanced. In this case, for providing a barrier against the injection of holes into the green light emitting layer 12, the HOMO energy level in the intermediate layer is set to be lower than the HOMO energy level of the hole transporting component in the green light emitting layer 12, whereby the injection of holes into the green light emitting layer 12 can be restricted.

On the other hand, when the intermediate layer has both a hole transporting property and an electron blocking property, it is possible to enhance the probabilities of re-coupling between electric charges in the green light emitting layer and the red light emitting layer which are disposed on the cathode 5 side relative to the intermediate layer.

Furthermore, the present invention is not limited to the configuration wherein an anode 3 is provided on a substrate 2, and an organic layer 4 and a cathode 5 are laminated on the anode 3; the invention is applicable also to an organic EL device having a configuration wherein a cathode is provided on a substrate 2, and an organic layer and an anode are laminated in this order on the cathode. Incidentally, in this case also, by appropriately selecting the materials and film thicknesses of the cathode and the anode, it is possible to obtain both of a top emission type configuration and a bottom emission type configuration, and to obtain the same effects as those of the above-described organic EL devices 1, 1' and 1".

EXAMPLES

Example 1

In Example 1, the bottom emission type organic EL device 1' described referring to FIG. 2 was manufactured as follows.

First, a cell for an organic EL device was produced in which a film of ITO (about 100 nm thick) as an anode 3 was formed on a substrate 2 composed of a 30 mm×30 mm glass plate, and other region than a central 2 mm×2 mm light emission region of the anode 3 was masked with an insulation film (omitted in the figure) by use of a photosensitive organic insulation material. Next, a metallic mask having an opening was disposed on the upper side of and in proximity to the substrate 2 in the condition where the opening was matched to the exposed portion of the anode 3 (ITO) to be each light emission region, and the following organic layers were sequentially formed by a vacuum evaporation method under a vacuum of $10^{-4}$ Pa or below.

First, as the hole transport layer 10, a film of m-MTDATA (4,4',4"-tris(3-methylphenylphenylamino)-triphenylamine) represented by the following formula (3) was formed in a thickness of 20 nm, and then a film of α-NPD (α-naphthyl-diamine)Bis[N-(1-nephthyl)-N-phenyl]benzidine represented by the following formula (4) was formed in a thickness of 20 nm. The vapor deposition rate was set to 0.1 nm/sec.

Formula (3), Formula (4):

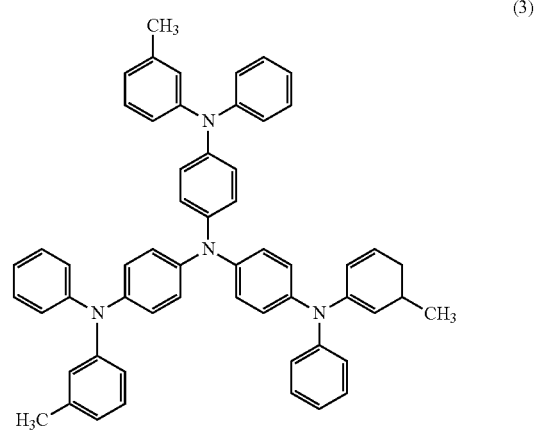

m-MTDATA (3)

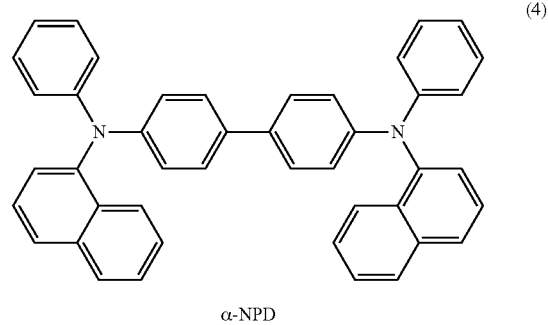

α-NPD (4)

Next, as the red light emitting layer 11, a co-deposition film composed of DPVBi of the following formula (5) as a host doped with 30% of BSN of the following formula (6) as a red light emitting material was formed in a thickness of 5 nm. The vapor deposition rate was set to 0.2 nm/sec.

Formula (5), Formula (6):

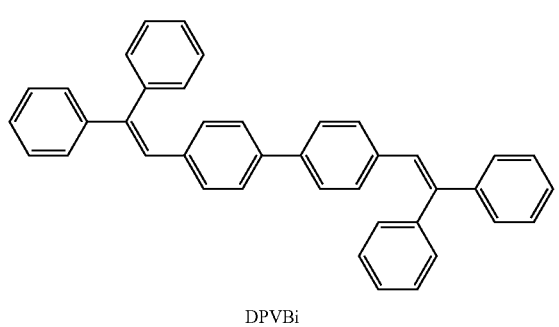

DPVBi

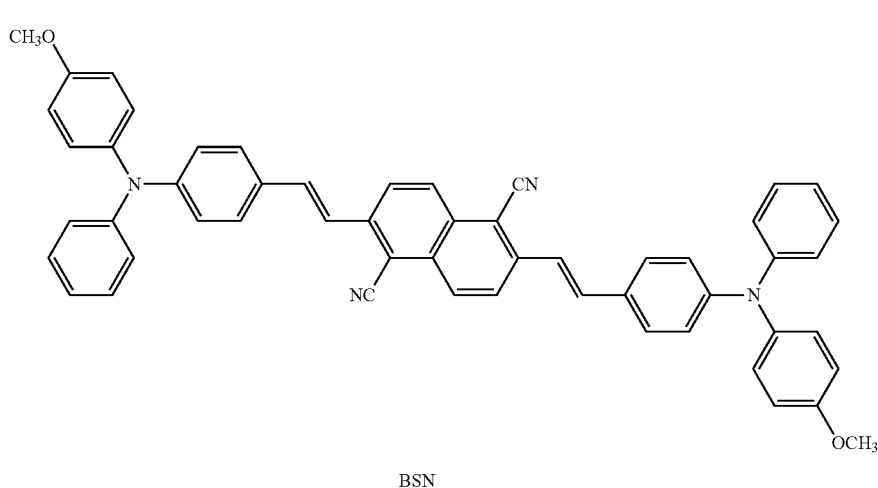

BSN

Thereafter, as the green light emitting layer 12, a co-deposition film composed of a mixture of DPVBi and α-NPD in a mixing ratio of 1:1 as a host doped with 1% of cumarin 6 of the following formula (7) as a green light emitting material was formed in a thickness of 10 nm. The vapor deposition rate was set to 0.2 nm/sec.

Formula (7):

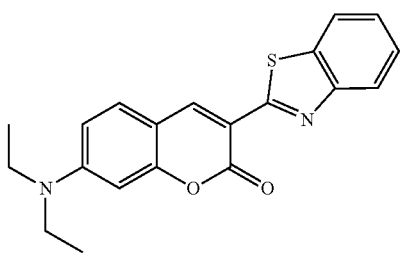

Coumarin 6

Then, a film of α-NPD was formed in a thickness of 3 nm as an intermediate layer "a" having a hole transporting property. The vapor deposition rate was set to 0.1 nm/sec. Incidentally, α-NPD has a HOMO-LUMO energy gap greater than the energy gap of cumarin 6 which is a green light emitting material in the green light emitting layer 12. In addition, the LUMO energy level in α-NPD is higher than the LUMO energy level of DPVBi which is an electron transporting component in the green light emitting layer 12.

Further, as the blue light emitting layer 13, a co-deposition layer composed of DPVBi as a host doped with 3% of 4,4'-(Bis(9-ethyl-3-carbazovinylene)-1,1'-biphenyl (BCzVBi) of the following formula (8) as a blue light emitting material was formed in a thickness of 30 nm. The vapor deposition rate was set to 0.2 nm/sec.

Formula (8):

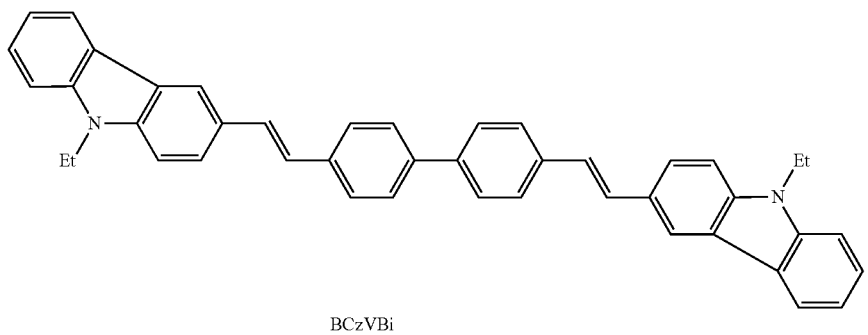

BCzVBi

Then, as the electron transport layer 14, a film of Alq3 represented by the following formula (9) was formed in a thickness of 20 nm. The vapor deposition rate was set to 0.2 nm/sec.

Formula (9):

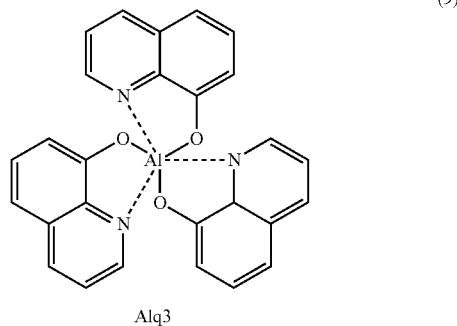

Alq3

Next, as the cathode 5, a thin film of Mg and Ag with a co-deposition ratio of 10:1 was formed in a thickness of 50 nm, and a film of Ag was formed in a thickness of 150 nm. The vapor deposition rate was set to 0.5 nm/sec.

Figure 5:
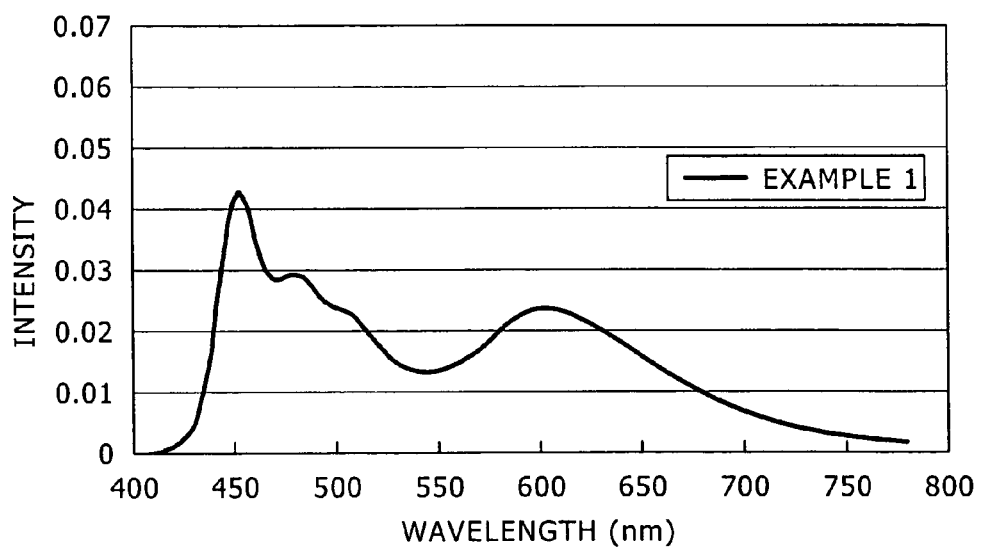
FIG. 5 shows the emission spectrum of an organic EL device produced in Example 1.

The emission spectrum of the organic EL device in Example 1 manufactured as above-described is shown in FIG. 5. As shown in the figure, it was confirmed that blue, green and red light emission components can be obtained from the organic EL device according to Example 1. In addition, light emission with a luminance of 1337 cd/m$^2$ and CIE chromaticity (0.319, 0.294) at a current density of 25 mA/cm$^2$ was obtained evenly over the light emission surface.

Example 2

Figure 6:
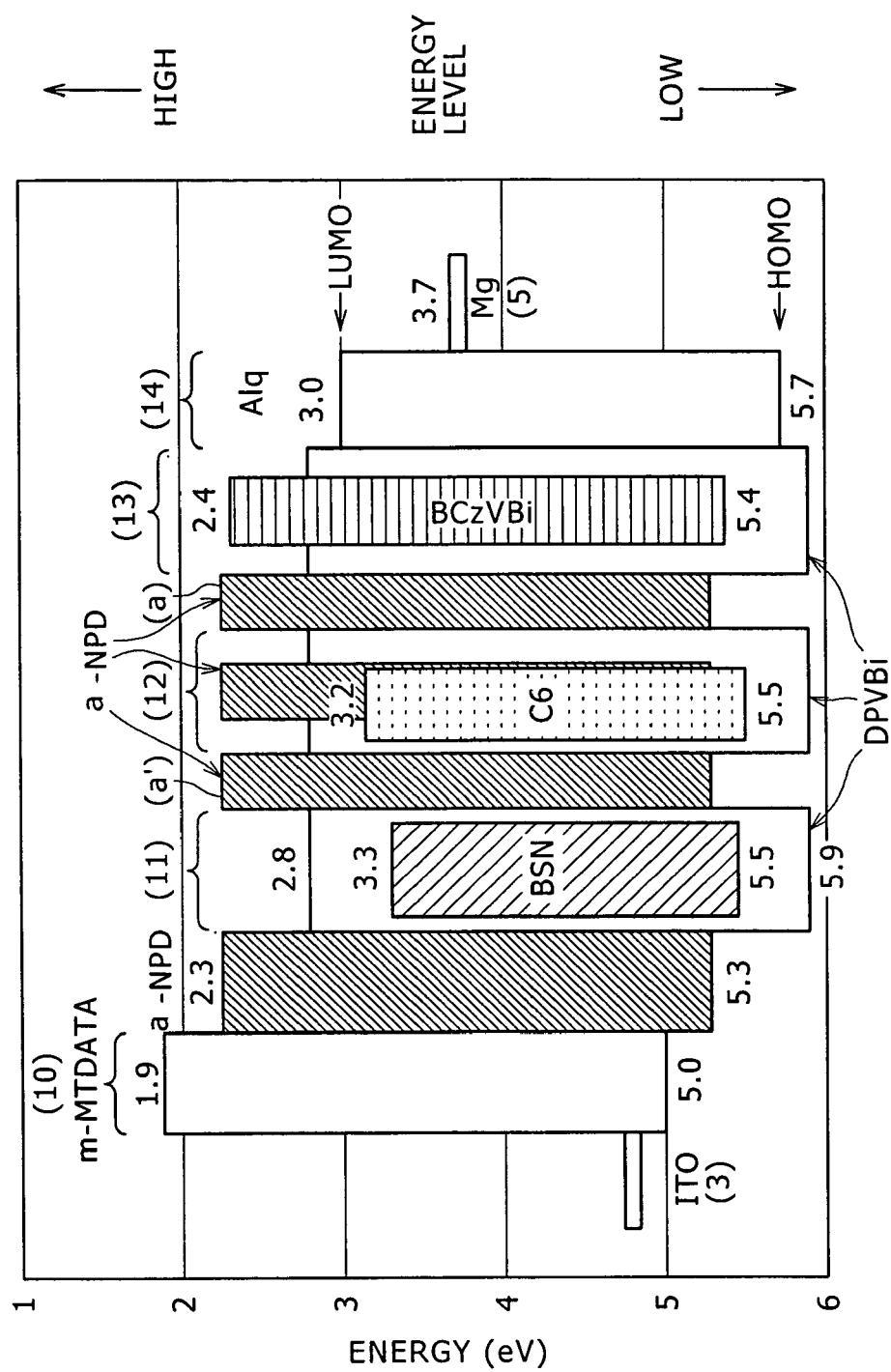
FIG. 6 is a schematic diagram showing the energy level in an organic film in Example 2.

In Example 2, an organic EL device 1" of the bottom emission type described referring to FIG. 4 was manufactured. Incidentally, FIG. 6 shows a schematic diagram of the energy level in an organic layer in Example 2.

In this case, the bottom emission type organic EL device 1" was manufactured in the same manner as in manufacturing the organic EL device in Example 1 above, except that a step of forming an intermediate layer "a'" between the red light emitting layer 11 and the green light emitting layer 12 was added to the manufacturing procedure in Example 1. It should be noted here, however, that the intermediate layer "a" between the green light emitting layer 12 and the blue light emitting layer 13 was formed in a film thickness of 2 nm (in Example 1, the film thickness was 3 nm). Besides, a film of α-NPD was formed in a thickness of 2 nm as the intermediate layer "a'" between the red light emitting layer 11 and the green light emitting layer 12. The vapor deposition rate was set to 0.1 nm/sec. Incidentally, α-NPD constituting the intermediate layer "a'" has a HOMO-LUMO energy gap greater than the energy gap of BSN which is a red light emitting material in the red light emitting layer 11. In addition, the LUMO energy level of α-NPD is higher than the LUMO energy level of BSN serving as an electron transporting component in the red light emitting layer 11.

Figure 7:
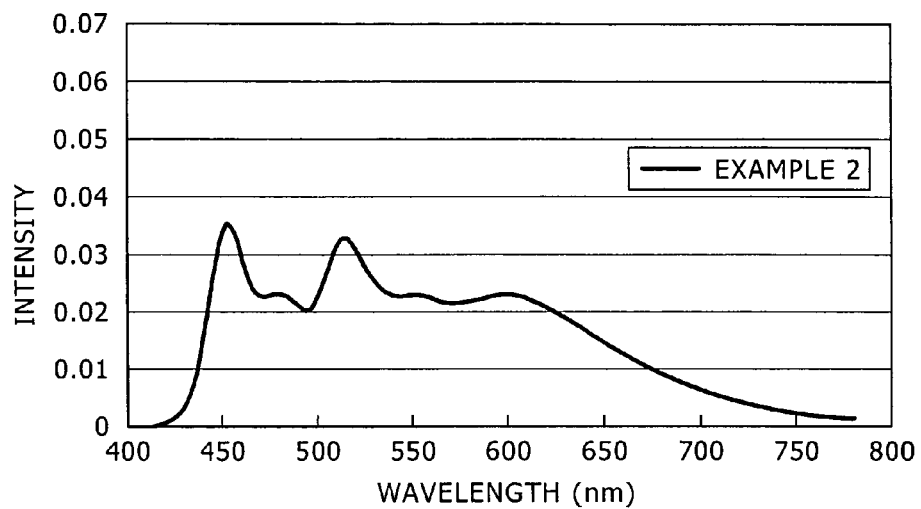
FIG. 7 shows the emission spectrum of an organic EL device produced in Example 2.

The emission spectrum of the organic EL device in Example 2 manufactured as above is shown in FIG. 7. As shown in this figure, it was confirmed that the blue, green and red light emission components can be obtained from the organic EL device in Example 2. In addition, light emission with a luminance of 1706 cd/m$^2$ and CIE chromaticity (0.324, 0.362) at a current density of 25 mA/cm$^2$ was obtained evenly over the light emission surface.

Comparative Example

In Comparative Example, an organic EL device having a configuration obtained by omitting the intermediate layer "a" from the configuration of the organic EL device 1' manufactured in Example 1 above was manufactured. The organic EL device was manufactured following the same manufacturing procedure in the above-described example, except for omitting the step of forming the intermediate layer a.

Figure 8:
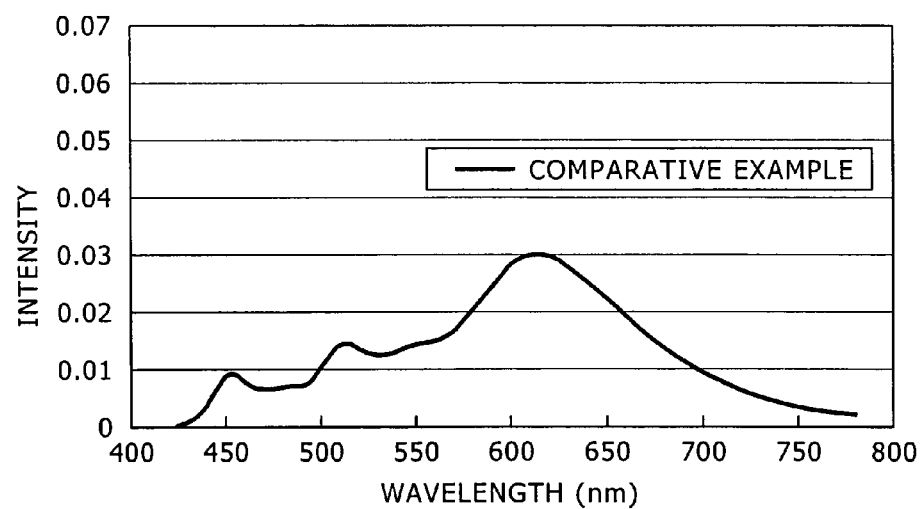
FIG. 8 shows the emission spectrum of an organic EL device manufactured in Comparative Example.

The emission spectrum of the organic EL device in Comparative Example manufactured as above is shown in FIG. 8. As shown in this figure, it was confirmed that the blue, green and red light emission components can be obtained from the organic EL device in Comparative Example. Light emission with a luminance of 1311 cd/m$^2$ and CIE chromaticity (0.392, 0.390) at a current density of 25 mA/cm$^2$ was obtained.

However, from a comparison of the emission spectra (Examples 1 and 2) in FIGS. 5 and 7 with the emission spectrum (Comparative Example) in FIG. 8, it was confirmed that light emission with a greater blue light emission component and a better balance of white light emission can be obtained with an organic EL device in which the intermediate layer is provided according to Example.

INDUSTRIAL APPLICABILITY

As has been described above, according to the organic EL device of the present invention, rays in different wavelength regions can be emitted with a good balance and at a high efficiency. Therefore, by laminating the light emitting layers for blue, green and red emission colors, it is possible to achieve white light emission with a good balance of luminous intensities and a good luminous efficacy. In addition, according to the display obtained by combining the organic EL devices with color filters, rays in the emission colors can be taken out in a good balance, and it is possible to configure a panel such that display with excellent color reproduction characteristics can be achieved.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. An organic EL device comprising:
a plurality of light emitting layers including a red light emitting layer, a green light emitting layer, and a blue light emitting layer laminated between an anode and a cathode;
an electron transport layer formed in contact with the cathode; and
an intermediate layer comprised of an organic material provided in at least one location between the light emitting layers, said intermediate layer having an electron blocking property and a hole transporting property,
wherein the green light emitting layer comprises a hole transporting material and an electron transporting material, and
wherein the red light emitting layer is formed in contact with a hole transporting layer that is formed on the anode, and
wherein an intermediate layer composition of the intermediate layer is different than an electron transport composition of the electron transport layer and different than a hole transporting composition of the hole transporting layer.

2. The organic EL device as set forth in claim 1, wherein a HOMO-LUMO energy gap of the intermediate layer is greater than a HOMO-LUMO energy gap of at least one material constituting the light emitting layers disposed adjacent to the intermediate layer.

3. The organic EL device as set forth in claim 2, wherein the HOMO-LUMO energy gap of the intermediate layer is greater than a HOMO-LUMO energy gap of all of the materials constituting the light emitting layers disposed adjacent to the intermediate layer.

4. The organic EL device as set forth in claim 1, wherein the intermediate layer is provided at least between the green light emitting layer and the blue light emitting layer, thereby restricting the injection of electrons into the green light emitting layer and promoting the injection of holes into the blue light emitting layer.

5. The organic EL device as set forth in claim 4, wherein a LUMO energy level of the intermediate layer having a hole transporting property is higher than a LUMO energy level of an electron transporting component in the green light emitting layer.

6. The organic EL device as set forth in claim 1, wherein the intermediate layer is provided at least between the red light emitting layer and the green light emitting layer, thereby restricting the injection of electrons into the red light emitting layer and promoting the injection of holes into the green light emitting layer.

7. The organic EL device as set forth in claim 6, wherein a LUMO energy level of the intermediate layer having a hole transporting property is higher than the LUMO energy level of an electron transporting component in the red light emitting layer.

8. The organic EL device as set forth in claim 6, wherein the organic material for the intermediate layer includes at least one of TPD and CBP.

9. The organic EL device as set forth in claim 1, wherein the green light emitting layer is formed directly on the red light emitting layer.

10. A display comprising:
a color filter on a light take-out surface side of an organic EL device comprising: a plurality of light emitting layers including a red light emitting layer, a green light emitting layer, and a blue light emitting layer laminated between an anode and a cathode;
an electron transport layer formed in contact with the cathode; and
an intermediate layer provided in at least one location between the light emitting layers, said intermediate layer having an electron blocking property and a hole transporting property thereby restricting the injection of electrons into the green light emitting layer and promoting the injection of holes into the blue light emitting layer, wherein the green light emitting layer comprises a hole transporting material and an electron transporting material, and
wherein the red light emitting layer is formed in contact with a hole transporting layer that is formed on the anode, and
wherein an intermediate layer composition of the intermediate layer is different than an electron transport composition of the electron transport layer and different than a hole transporting composition of the hole transporting layer.

11. An organic EL device comprising:
an anode;
a hole transport layer formed on the anode;
a plurality of light emitting layers including a red light emitting layer, a green light emitting layer, and a blue light emitting layer laminated on the hole transport layer such that the red light emitting layer is formed in contact with the hole transport layer that is formed directly on the anode;
an electron transport layer formed on the blue light emitting layer;
a cathode formed on the electron transport layer; and
an intermediate layer comprised of an organic material provided between the blue light emitting layer and the green light emitting layer, said intermediate layer having an electron blocking property and a hole transporting property, thereby restricting the injection of electrons into the green light emitting layer and promoting the injection of holes into the blue light emitting layer,
wherein the red light emitting layer is configured so that a portion of the holes injected through the hole transport layer are re-coupled in the red light emitting layer to give red light emission and a remainder of the holes are transported into the green light emitting layer,
wherein the green light emitting layer comprises a hole transporting material and an electron transporting material, such that some of the holes transferred from the red light emitting layer are re-coupled in the green light emitting layer to give green light emission and the remainder of the holes are transported into the blue light emitting layer, and such that some of the electrons injected from the blue light emitting layer contribute to green light emission and the remainder of the electrons are transported to the red light emitting layer, and wherein an intermediate layer composition of the intermediate layer is different than an electron transport composition of the electron transport layer and different than a hole transporting composition of the hole transporting layer.

12. An organic EL device comprising:

a plurality of light emitting layers including a red light emitting layer, a green light emitting layer, and a blue light emitting layer laminated between an anode and a cathode;

an electron transport layer formed in contact with the cathode; and an intermediate layer comprised of an organic material provided in at least one location between the light emitting layers, said intermediate layer having an electron transporting property and a hole blocking property, wherein the green light emitting layer comprises a hole transporting material and an electron transporting material, and wherein the red light emitting layer is formed in contact with a hole transporting layer that is formed on the anode, and wherein an intermediate layer composition of the intermediate layer is different than an electron transport composition of the electron transport layer and different than a hole transporting composition of the hole transporting layer.

* * * * *